US006501303B1

(12) United States Patent
Suyama

(10) Patent No.: US 6,501,303 B1
(45) Date of Patent: Dec. 31, 2002

(54) SEMICONDUCTOR INTEGRATED CIRCUIT

(75) Inventor: Junichi Suyama, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/659,573

(22) Filed: Sep. 11, 2000

(51) Int. Cl.$^7$ ............................................. H03K 5/22
(52) U.S. Cl. ........................ 327/81; 327/540; 327/543
(58) Field of Search ............................ 327/77, 78, 79, 327/80, 81, 89, 205, 538, 540, 541, 543, 545, 546

(56) References Cited

U.S. PATENT DOCUMENTS

| | | | | |
|---|---|---|---|---|
| 3,675,045 A | * | 7/1972 | Mullay | 327/88 |
| 3,943,380 A | * | 3/1976 | Morgan et al. | 327/89 |
| 5,319,265 A | * | 6/1994 | Lim | 327/205 |
| 5,369,319 A | * | 11/1994 | Goog et al. | 327/77 |
| 5,396,118 A | * | 3/1995 | Yaguchi | 327/516 |
| 5,581,206 A | * | 12/1996 | Chevallier | 327/81 |
| 5,856,756 A | * | 1/1999 | Sasahara et al. | 327/540 |
| 6,060,945 A | * | 5/2000 | Tsay | 327/543 |

FOREIGN PATENT DOCUMENTS

JP    6-51016    2/1994

* cited by examiner

*Primary Examiner*—Vuthe Siek
*Assistant Examiner*—Paul Dinh
(74) *Attorney, Agent, or Firm*—Volentine Francos, PLLC

(57) ABSTRACT

A determining circuit comprises an input section having a P-channel type MOS transistor applied with a voltage VT set based on a reference voltage applied to a gate electrode and a voltage according to a voltage of a terminal applied to a source electrode, and an output section with a voltage level that changes according to an output from a drain electrode of a P-channel-type MOS transistor of a voltage level that changes according to a further voltage. With this configuration, the determining circuit for determining switching over to a prescribed mode can be implemented which is not influenced by fluctuations in process factors by using the voltage outputted from the output section.

10 Claims, 5 Drawing Sheets

SEMICONDUCTOR INTEGRATED CIRCUIT

BACKGROUND OF THE INVENTION

1. Field of the Invention

The present invention relates to a semiconductor integrated circuit, and more particularly relates to a semiconductor integrated circuit equipped with a circuit for sensing whether a prescribed high voltage of a voltage greater than a supply voltage is applied to a prescribed terminal in order to make it possible to select a prescribed operating mode.

2. Description of the Related Art

In the related art, technology for this field is disclosed in the following papers.

FIG. 2 in Japanese Patent Publication Laid-open No. 6-51016 shows a circuit diagram of a related semiconductor integrated circuit disclosed in this document.

This semiconductor integrated circuit has a function for determining designation of an accelerated testing mode employing a voltage higher than a normal supply voltage based on a supply voltage applied to a supply terminal and is provided with a supply voltage sensing circuit 60, a supply voltage determining circuit 70, and a switching circuit 80 for the purpose of providing this function.

The supply voltage sensing circuit 60 comprises a dividing section consisting of diode-connected P-channel MOS transistors (hereinafter, a MOS transistor is referred to as "MOS" and a P-channel transistor is referred to as "PMOS") 61 and 62, and an N-channel MOS transistor (hereinafter referred to as "NMOS") 63, a threshold section constituted by a PMOS 64 and an NMOS 65, and an inverter 66. The supply voltage determining circuit 70 comprises a comparator having PMOS's 71 and 72 and NMOS's 73, 74 and 75, a voltage divider consisting of resistors 76 and 77, and an inverter 78. The switching circuit 80 comprises inverters 81 and NMOS's 82 and 83.

With this semiconductor integrated circuit, when the supply voltage VCC exceeds a prescribed supply voltage and rises to more than a certain fixed level at the supply voltage sensing circuit 60, the voltage of the dividing portion rises, and a voltage of an output signal VO1 changes from a ground voltage level (hereinafter referred to as "L") to a supply voltage level (hereinafter referred to as "H"). Further, when the supply voltage VCC rises to more than the certain fixed level at the supply voltage determining circuit 70, the voltage of the dividing portion becomes higher than a reference voltage VR and the voltage level of the output signal VO2 changes from "L" to "H".

One of the output signals VO1 and VO2 is supplied to a switching circuit 80, and one of the output signals VO1 and VO2 is selected according to the level of a mode select signal VM, with the selected output signal being outputted as an output voltage VO.

At the supply voltage sensing circuit 60, the voltage obtained at the voltage-dividing portion of the PMOS 61 and 62, and the NMOS 63 fluctuates dramatically due to processing factors when forming the semiconductor integrated circuit.

Such fluctuations become even larger when the number of PMOS's 61 and 62 connected in series in order to make the dividing ratio large is made large. On the other hand, at the supply voltage determining circuit 70, a comparator included within the supply voltage determining circuit 70 is comprised of a current mirror circuit. The comparison results of the comparator are therefore substantially not influenced when the balance between the threshold voltages of the NMOS transistors 73 and 74 fluctuates due to process factors.

The output signal VO2 can therefore be selected using a mode select signal VM from outside when a circuit for generating a reference voltage VR is provided internally. When there is no circuit for generating this reference voltage VR, output signal VO1 can be selected.

However, the following problems exist with this related semiconductor integrated circuit.

At the supply voltage sensing circuit 60, comparison results are influenced by fluctuations in process factors and accurate voltage detection is therefore difficult. On the other hand, at the supply voltage determining circuit 70, comparison results can be obtained that are not influenced by fluctuations in process factors, but the voltage that can be subjected to this determination is limited by the supply voltage VCC. In order to resolve the problems with the aforementioned related art, the present invention provides a semiconductor integrated circuit that is not influenced by fluctuations of process factors having a semiconductor circuit for determining whether an arbitrary input signal voltage is a prescribed voltage higher than the supply voltage VCC.

SUMMARY OF THE INVENTION

In order to achieve the aforementioned object, the semiconductor integrated circuit of the present invention comprises a terminal applied with a supply voltage or a voltage different from the supply voltage, a voltage generating circuit, applied with a reference voltage, for generating a control voltage based on the reference voltage, a comparator, for comparing a control voltage and a voltage applied to the terminal, and outputting a comparison result signal having a voltage corresponding to comparison results and an output circuit, inputted with the comparison result signal, and outputting an output signal for setting a prescribed operation mode and having a voltage level based on the voltage level of the comparison result signal.

The concept here is therefore to provide a circuit having a circuit for generating a divided voltage at the voltage generating circuit, and a circuit configuration for generating a divided voltage, and the object of the present invention is therefore achieved with this configuration.

DESCRIPTION OF THE PREFERRED EMBODIMENTS

Figure 1:
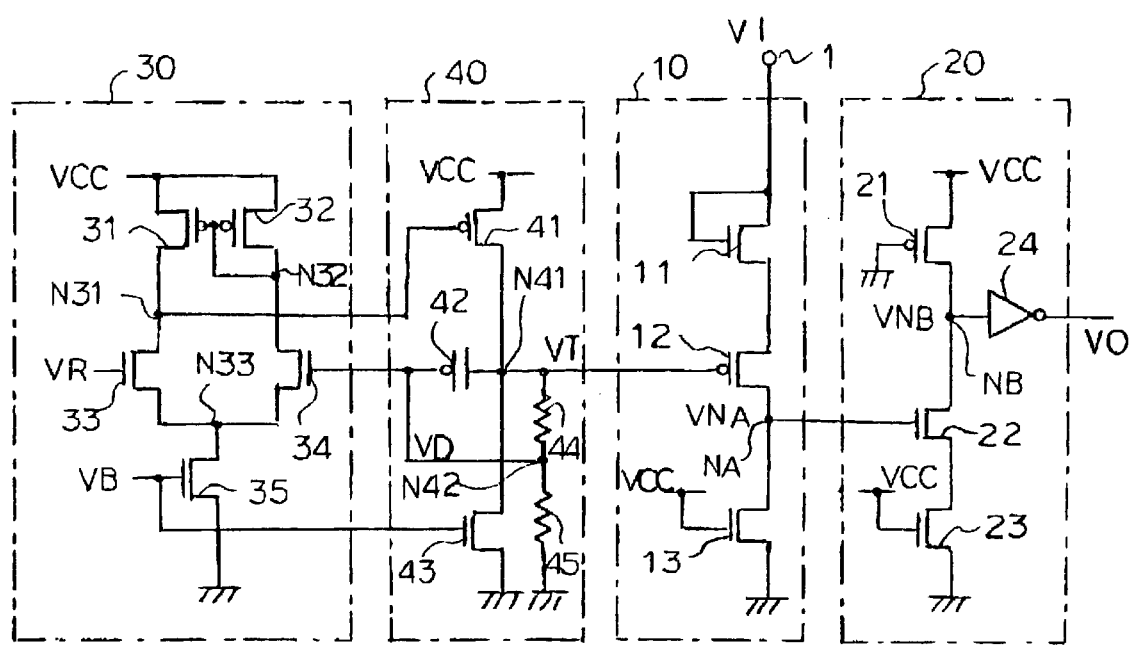
FIG. 1 is a circuit diagram showing part of a semiconductor integrated circuit of a first embodiment of the present invention.
Figure 2:
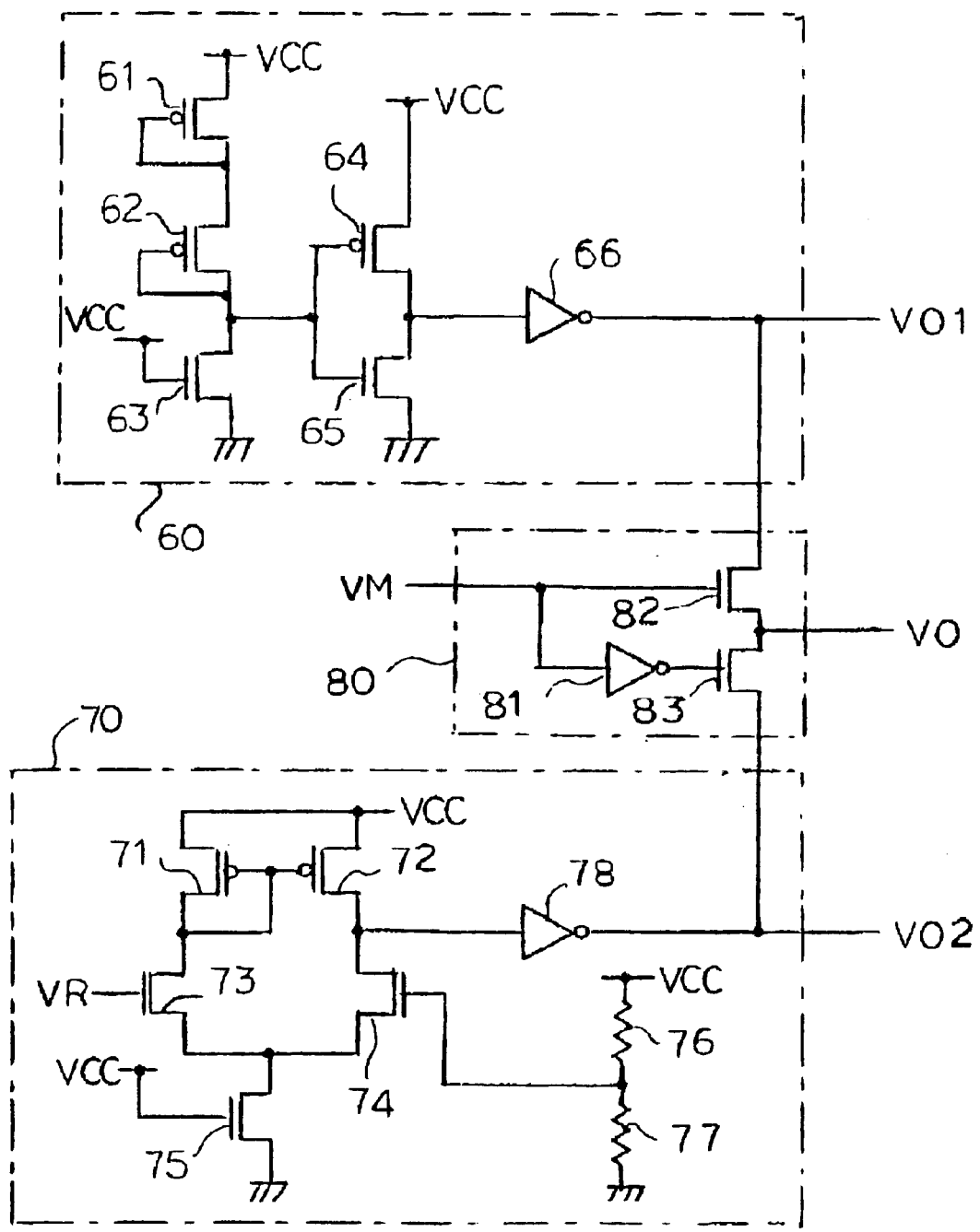
FIG. 2 is a circuit diagram of a related semiconductor integrated circuit.

FIG. 1 is a circuit diagram showing part of a semiconductor integrated circuit of a first embodiment of the present invention.

The semiconductor integrated circuit has a function for setting test mode etc. by, for example, applying a fixed voltage higher than a supply voltage VCC to a specific input terminal (for example, a clock terminal) 1. FIG. 1 shows, for determining an input voltage VI applied to the clock terminal 1 and obtaining an output signal VO for the results of the determination, an input section 10 taken as a comparator circuit, an output section 20 taken as an output circuit, a comparator section 30 taken as a voltage generating section, and an amplifier 40. Other functional blocks are omitted.

The input section 10 lowers the input voltage VI applied to the clock terminal 1 by just a fixed voltage for comparison with a control voltage VT so as to determine whether or not the input voltage VI is a prescribed voltage higher than the supply voltage VCC. The input section 10 comprises NMOS's 11 and 13, and a PMOS 12. A drain electrode (hereinafter referred to simply as "drain") and a gate electrode (hereinafter referred to simply as "gate") of an NMOS 11 are connected to the clock terminal 1 and a source electrode (hereinafter referred to simply as "source") is connected to a source of the PMOS 12. The drain of the PMOS 12 is connected to a node NA and a control voltage VT from the amplifier 40 is applied to the gate. The drain of the NMOS 13 is connected to the node NA, the gate of the NMOS 13 is connected to a supply voltage applying the supply voltage VCC, and the source is connected to ground.

The output section 20 is for outputting an output signal VO for setting the operating mode based on determination results for the input section 10. The output section 20 comprises an anomaly inverter consisting of a PMOS 21 and NMOS's 22 and 23, and a normal inverter 24. The source of the PMOS 21 is connected to the supply voltage source for applying the source voltage VCC, the gate is connected to a ground voltage supply for applying a ground voltage, and the drain is connected to the node NB. The drain of NMOS 22 is connected to node NB, the gate is connected to a node NA for outputting a comparison result signal having a voltage corresponding to comparison results of the input section 10, and the drain is connected to the drain of NMOS 23. The gate of the NMOS 23 is connected to the supply voltage source for applying the source voltage VCC and the source is connected to a ground voltage supply for applying the ground voltage GND. An input side of the inverter 24 is connected to the node NB. The output signal VO outputted from the output side of the inverter 24 is applied to a functional block (not shown) as an operating mode setting signal.

The comparator section 30 is a differential amplifier constituted by PMOS's 31 and 32, and NMOS's 33, 34 and 35. Sources of the PMOS's 31 and 32 are connected to the supply voltage source for applying the supply voltage VCC. The drain of the PMOS 31 is connected to the node N31, and the gate is connected to N32. The drain and gate of the PMOS 32 are connected to the node N32.onnected to the node N32. The drain of the NMOS 33 is connected to the node N31 and the source of the NMOS 33 is connected to a node N33. A reference voltage VR from a reference voltage generator (not shown) is applied to the gate of the NMOS 33. The drain of the NMOS 34 is connected to a node N32 and the source of the NMOS 34 is connected to the node N33. A divided voltage VD from the amplifier 40 is applied to the gate of the NMOS 34. The drain of the NMOS 35 is connected to a node N33 and the source of the NMOS 35 is connected to a ground voltage supply for applying the ground voltage GND. A bias voltage VB from a bias generator (not shown), for providing a fixed current to the NMOS 35, is applied to the gate of the NMOS 35.

The amplifier 40 comprises a PMOS 41, capacitor 42, NMOS 43, and voltage-dividing resistors 44 and 45. The source of the PMOS 41 is connected to the ground voltage supply for applying the supply voltage VCC, the gate is connected to node 31, and the drain is connected to node N41. The drain of NMOS 43 is connected to node N41, the source of NMOS 43 is connected to a ground voltage supply for applying the ground voltage GND, and a bias voltage VB is applied to the gate. Resistors 44 and 45 are connected in series across the node N41 and the ground voltage GND, with a connection point of the resistors 44 and 45 being node N42. A capacitor 42 for improving response characteristics is connected across node N41 and node N42. The capacitor 42 utilizes capacitance across the gate and source/drain of a PMOS and has a source side connected to node N41 and a gate side connected to node N42. The control voltage VT and the divided voltage VD are therefore outputted from node N41 and node N42, respectively.

Figure 3:
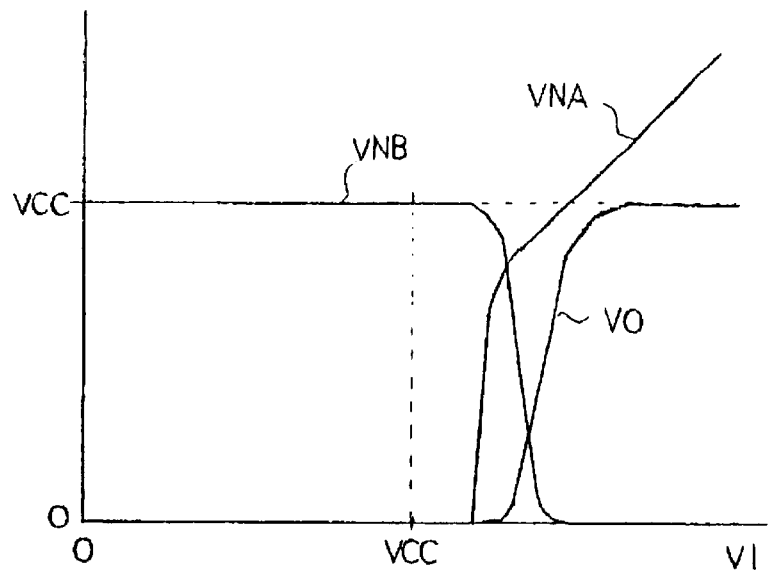
FIG. 3 is a signal waveform graph showing the operation of the circuit of FIG. 1.

FIG. 3 is a signal waveform diagram showing the operation of the circuit in FIG. 1, and shows the input voltage VI on the horizontal axis, and a voltage VNA of node NA, a voltage VNB of node NB, and the output signal VO corresponding to the input voltage VI on the vertical axis.

A description is now given with reference to FIG. 3 of the operation of FIG. 1.

An output voltage of the node N31 of the comparator section 30 is applied to the gate of the PMOS 41 of the amplifier 40 and the voltage outputted at the node N41 of the amplifier 40 is divided by the resistors 41 and 42 and fed-back to the gate of the NMOS 34. The gate voltages of the NMOS's 33 and 34 of the comparator 30 therefore become equal due to this feedback operation.

Taking resistance values of the resistors 41 and 42 to be R1 and R2, the divided voltage VD of the node N42 is VR1×VR2/(R1+R2) and the control voltage VT of the node N41 can be expressed by the following equation.

$$VT = (1 + R1/R2)VR \quad (1)$$

The control voltage VT is applied to the gate of the PMOS 12 of the input section 10 and the voltage VNA of the node NA of the input section 10 is given by the following equation (2);

$$VNA = VI - VT - Vtn - Vtp - \alpha \quad (2)$$

where Vtn: the threshold voltage of the NMOS 11,
Vtp: the threshold voltage of the PMOS 12, and
α: the voltage drop at the NMOS 13.

As shown in FIG. 3, the input voltage VI applied to the clock terminal 1 exceeds the supply voltage VCC, and when the voltage VNA of the node NA exceeds the threshold value of the anomaly inverter of the output section 20, the voltage level of the voltage VNB of the node NB changes from "H" to "L". In accompaniment with this, the voltage level of the output signal VO of the output section 20 changes from "L" to "H". The output signal VO is supplied to a functional block (not shown) as an operation mode setting signal and the operating mode of the semiconductor circuit is, for example, changed over to test mode.

The semiconductor integrated circuit of the first embodiment has the following benefits (i) to (iii).

(i) At the input section 10, the input voltage VI applied to the clock terminal 1 is the subject of determinations and operation using a normal supply voltage VCC is possible.

(ii) The input section 10 is constituted by just a small number of elements (3), so that circuit scale can be simplified and variations in determination level due to the influence of process factor fluctuations occurring during integrated circuit forming can be made small.

The determination level can be set to a broader range by changing the ratio of the resistance values R1 and R2 of the resistors 41 and 42. The ratio of the resistance values R1 and R2 is decided by the dimensions of the circuit pattern and is therefore not influenced by fluctuations in process factors occurring during forming of the integrated circuit.

Figure 4:
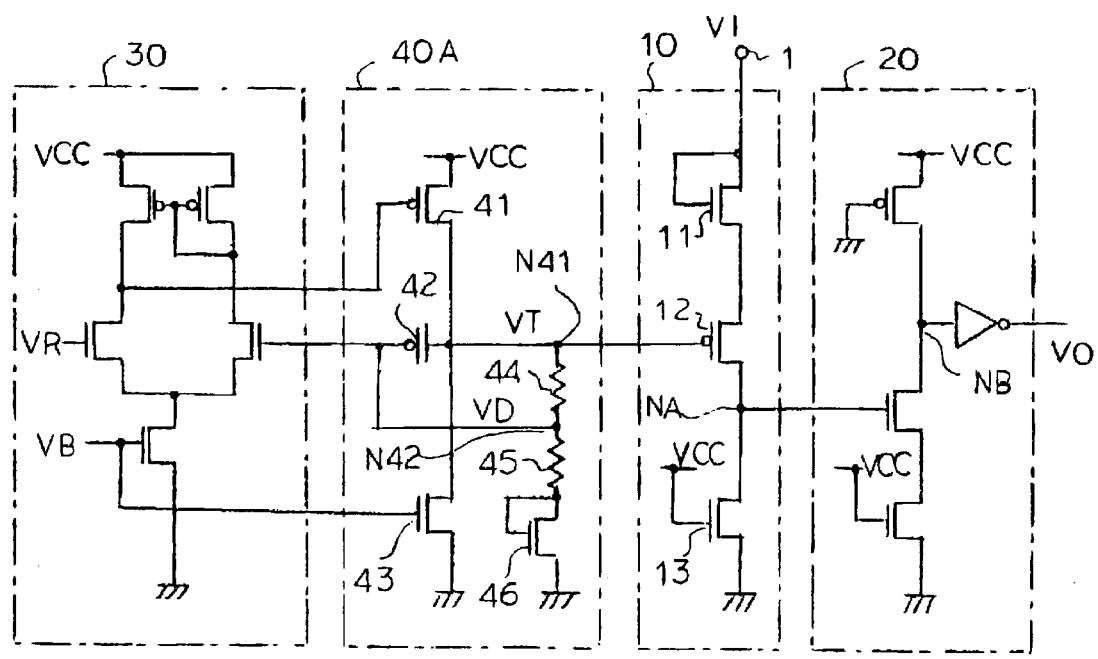
FIG. 4 is a circuit diagram showing part of a semiconductor integrated circuit of a second embodiment of the present invention.

FIG. 4 is a circuit diagram showing part of an integrated circuit of a second embodiment of the present invention, with elements common to FIG. 1 being given the same numerals.

In the semiconductor integrated circuit of this embodiment, an amplifier 40A is provided in place of the amplifier 40 of the semiconductor integrated circuit of FIG. 1.

In addition to the PMOS 41, capacitor 42, NMOS 43 and voltage-dividing resistors 44 and 45, which are the same as those of the amplifier 40 in FIG. 1, the amplifier 40A also has an NMOS 46 connected in series with the resistors 44 and 45.

The NMOS 46 has the same characteristics as the NMOS 11 of the input section 10.

The drain and gate electrode of the NMOS 46 are connected to one end of the resistor 45, and the source is connected to the ground voltage supply for applying the ground voltage GND. Other aspects of the configuration are the same as for FIG. 1.

With this configuration, the divided voltage VD of the node 42 is given by VT×(R2+Vtn)/(R1+R2+Vtn) and the control voltage VT of the node N41 can be expressed by the following equation (3).

$$VT=(1+R1/R2)VR-(R1/R2)Vtn \qquad (3)$$

By substituting equation (3) into equation (2), the voltage VNA of the node NA is given by the following equation (4).

$$VNA=VI-(1+R1/R2)VR-(1-R1/R2)Vtn-Vtp-\alpha \qquad (4)$$

Comparing equation (2) and equation (4), in equation (4), the coefficient for Vtn is small, which means that the influence of the threshold value voltage of the NMOS 11 on the voltage VNA is small.

Other aspects of the configuration are the same as for FIG. 1.

The semiconductor integrated circuit of the second embodiment has the following benefits (iv) and (v), in addition to the benefits (i) to (iii).

(iv) The NMOS 46 is connected in series with the resistances 44 and 45 for voltage-dividing of the amplifier 40A and the characteristics of this NMOS 46 are set to be the same as the characteristics of the NMOS 11 of the input section 10. As a result, the influence of fluctuations in the process factors is suppressed and an output signal VO of substantially the designed-for characteristics can be obtained.

(v) The term Vtn in equation (4) can be made zero by setting the resistance values R1 and R2 of the resistors 44 and 45 for voltage-dividing to be the same. The designed-for characteristics can therefore be obtained with no influence whatsoever on the threshold voltage of the NMOS 11.

Figure 5:
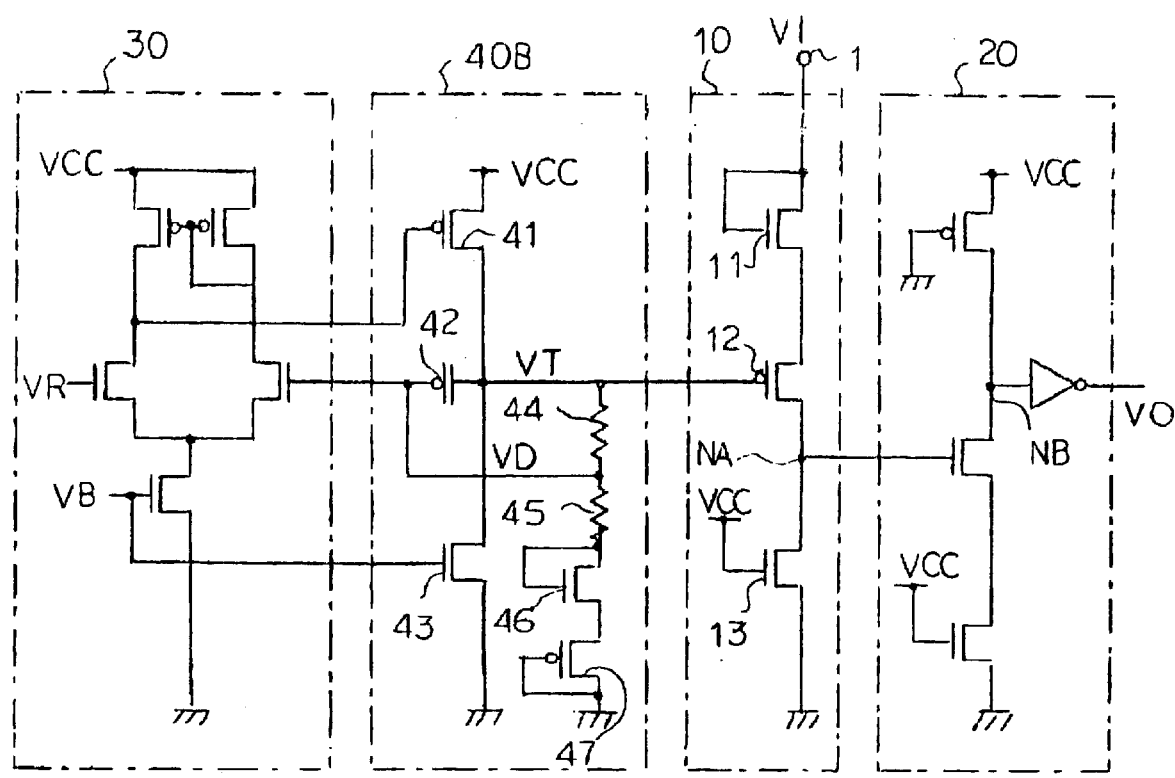
FIG. 5 is a circuit diagram showing part of a semiconductor integrated circuit of a third embodiment of the present invention.

FIG. 5 is a circuit diagram showing part of an integrated circuit of a third embodiment of the present invention, with elements common to FIG. 1 being given the same numerals.

In the semiconductor integrated circuit of this embodiment, an amplifier 40B is provided in place of the amplifier 40 of the semiconductor integrated circuit of FIG. 1.

In addition to the PMOS 41, capacitor 42, NMOS 43 and voltage-dividing resistors 44 and 45, which are the same as those of the amplifier 40 FIG. 1, the amplifier 40B also has the NMOS 46 and a PMOS 47 connected in series with the resistors 44 and 45.

The NMOS 46 has the same characteristics as the NMOS 11 of the input section 10.

The drain and gate electrode of the NMOS 46 are connected to one end of the resistor 45, and the source is connected to the source of the PMOS 47. The PMOS 47 has the same characteristics as the PMOS 12 of the input section 10. The drain and gate of the PMOS 47 are connected to the ground voltage supply for applying the ground voltage GND. Other aspects of the configuration are the same as for FIG. 1.

With this configuration, the divided voltage VD of the node 42 is given by VT×(R2+Vtn+Vtp)/(R1+R2+Vtn+Vtp) and the control voltage VT of the node N41 can be expressed by the following equation (5).

$$VT=(1+R1/R2)VR-(R1/R2)(Vtn+Vtp) \qquad (5)$$

By substituting equation (5) into equation (2), the voltage VNA of the node NA is given by the following equation (6).

$$VNA=VI-(1+R1/R2)VR-(1-R1/R2)(Vtn+Vtp)-\alpha \qquad (6)$$

Comparing equation (2) and equation (6), in equation (6), the coefficient for (Vtn+Vtp) is small, which means that the influence of the threshold value voltages of the NMOS 11 and PMOS 12 on the voltage VNA is small.

Other aspects of the configuration are the same as for FIG. 1.

The semiconductor integrated circuit of the third embodiment has the following benefits (vi) and (vii), in addition to the benefits (i) to (iii).

(vi) The NMOS 46 and PMOS 47 are connected directly to the resistances 44 and 45 for voltage-dividing of the amplifier 40B and the characteristics of the NMOS 46 and PMOS 47 are set to be the same as the characteristics of the NMOS 11 and PMOS 12 of the input section 10. As a result, the influence of fluctuations in the process factors is suppressed and an output signal VO of substantially the designed-for characteristics can be obtained.

The term (Vtn+Vtp) in equation (6) can be made zero by setting the resistance values R1 and R2 of the resistors 44 and 45 for voltage-dividing to be the same. The designed characteristics can therefore be obtained without any influence on the threshold voltages of the NMOS 11 and PMOS 12.

Figure 6:
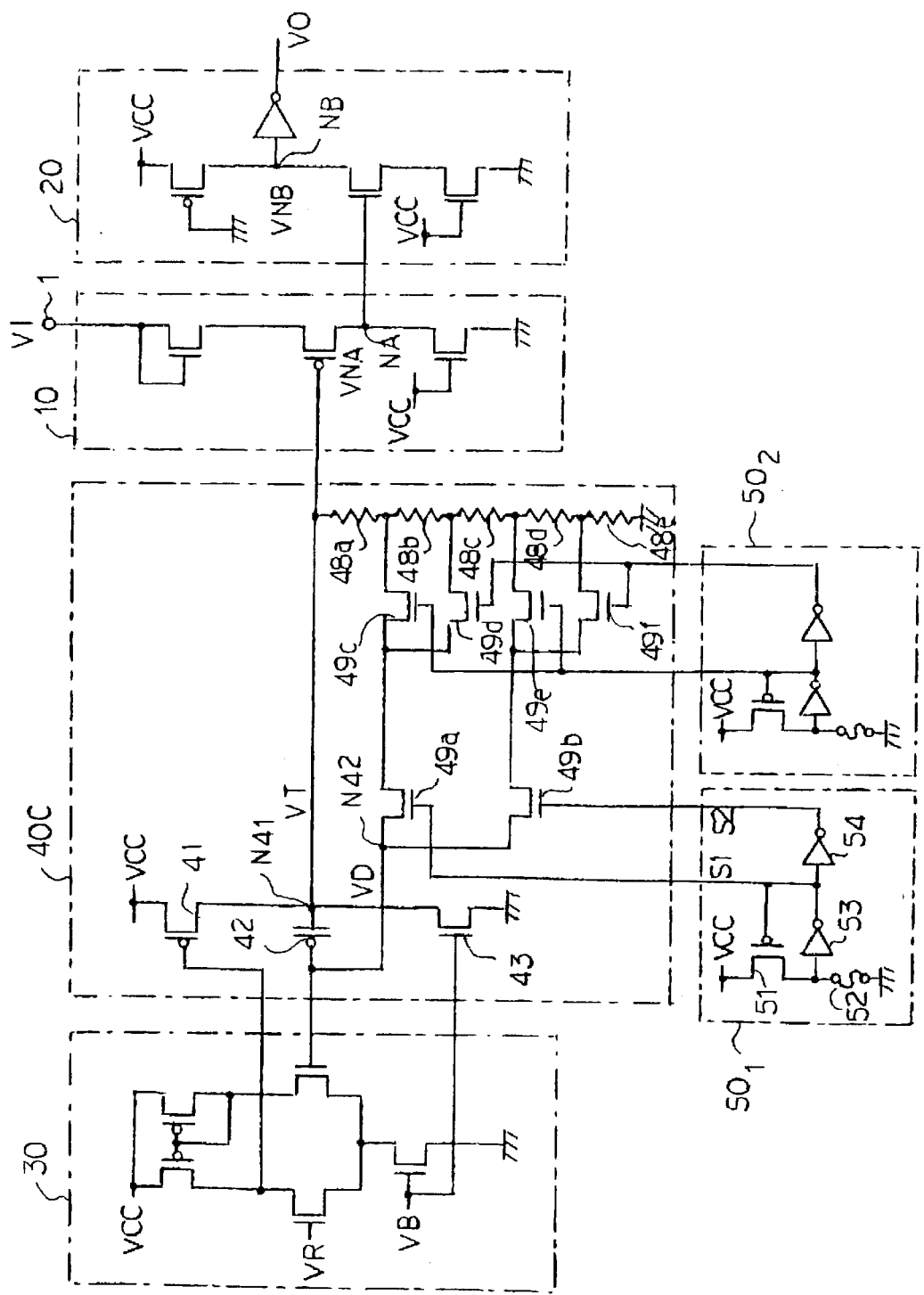
FIG. 6 is a circuit diagram showing part of a semiconductor integrated circuit of a fourth embodiment of the present invention.

FIG. 6 is a circuit diagram showing part of an integrated circuit of a fourth embodiment of the present invention, with elements common to FIG. 1 being given the same numerals.

With the semiconductor integrated circuit of this embodiment, an amplifier 40C is provided in place of the amplifier 40 of the semiconductor integrated circuit of FIG. 1, and setting circuits (for example, a setting section) $50_1$ and $50_2$ for setting the voltage ratio of the amplifier 40C are also provided.

The amplifier 40C comprises the PMOS 41, the NMOS 43, the capacitor 42 for improving response characteristics, five resistors 48a, 48b, . . . , 48e, and six NMOS's 49a, 49b, . . . , 49f for switching. As with the amplifier 40 in FIG. 1, the source of the PMOS 41 is connected to the supply voltage source for applying the supply voltage VCC, the gate is connected to the node N31, and the drain is connected to the node N41. The drain of NMOS 43 is connected to node N41, the source of NMOS 43 is connected to the ground voltage supply for applying the ground voltage GND, and a bias voltage VB is applied to the gate. A capacitor 42 is connected across node N41 and node N42.

Series-connected resistors 48a to 48e forming the voltage-dividing circuit are connected across the node N41 and the ground voltage GND. The NMOS transistors 49a to 49f for switching forming a 4:1 select circuit in a two-stage configuration are connected across each of the points of connection of the resistors 48a to 48e and the node 42. The setting circuit 50, and 502 set the select signals of the NMOS's 49a to 49f of the amplifier 40C and have the same configuration. For example, the setting circuit $50_1$ comprises a PMOS 51, fuse 52, and inverters 53 and 54.

The source of the PMOS 51 is connected to the supply voltage VCC and the drain is connected to the ground voltage supply for applying the ground voltage GND via the fuse 52. The input side of the inverter 53 is connected to the drain of the PMOS 51, and the output side of the inverter 53 is connected to the gate of the PMOS 51 and the input side of the inverter 54. Complementary select signals S1 and S2 are outputted from the output side of the inverters 53 and 54 and are applied to the gates of NMOS 49a and 49b, respectively. At the setting circuit 501, when the fuse 52 is not broken, the voltage levels of the select signals S1 and S2 are set to "H" and "L", respectively, and are set to "L" and "H", respectively, by breaking the fuse 52.

With this kind of semiconductor integrated circuit, one of four dividing ratios obtained using the resistors 48a to 48e is selected depending on the state of the fuses 52 within the setting circuits $50_1$ and $50_2$, and this divided voltage VD can then be outputted to the node 42. The operation depending on the divided voltage VD set using the setting circuits $50_1$ and $50_2$ is the same as the operation of the semiconductor integrated circuit of FIG. 1.

The semiconductor integrated circuit of the fourth embodiment has the following benefit (viii), in addition to the benefits (i) to (iii).

(viii) After forming the semiconductor integrated circuit, the most appropriate of four voltage-dividing ratios can by selected depending on the presence or absence of breaks in the fuses 52 within the setting circuits $50_1$ and $50_2$. The influence of fluctuations can therefore be kept to a minimum and characteristics that are substantially as designed can be obtained by subjecting the fuses 52 to appropriate processing in later processing steps even when fluctuations due to factors in the processing steps occur.

The present invention is by no means limited to the above embodiments, and various modifications are possible. Modified examples may be, for example, as described in (a) to (e) in the following.

(a) The terminal applying the input signal VI of the input section 10 is by no means limited to the clock terminal 1. In the case of memory, for example, an address terminal etc. can be used.

(b) The configuration of the input terminal 10 and the output section 20 is by no means limited to that shown in the drawings, and a configuration where, for example, NMOS and PMOS devices are changed over is also possible.

(c) the configuration of the comparator 30 and the amplifier 40 is by no means limited to that shown in the drawings. For example, substantially the same operation is possible even with the capacitor 42 omitted.

(d) It is also possible to replace the NMOS 46 of the amplifier 40A of FIG. 4 with the PMOS 47 shown in FIG. 5 so as to suppress the influence of the PMOS 12 of the input section 10.

(e) The number of resistors 48a to 48e in FIG. 6 is by no means limited to five, and if a still larger number of resistors 48 are connected in series, the selection range can be broadened. It is, however, necessary to change the configuration of the NMOS 49 for circuit selection and the setting circuit 50 according to the number of resistors 48.

As described in detail above, according to the present invention, an arbitrary input terminal can be used to carry out setting of an operating mode by determining whether or not an input voltage applied to a specific input terminal is a prescribed voltage higher than the supply voltage.

Further, circuit configuration is simplified and the influence of fluctuations in process factors is reduced by configuring a comparator circuit from three MOS's.

Further, at the voltage generating circuit, a divided voltage is generated by first and second resistors connected in series and a threshold voltage is outputted based on this divided voltage so that a threshold voltage with a broad range can be generated in a straightforward manner.

With this voltage generating circuit, fluctuations due to process factors can be suppressed and an output signal having substantially the designed-for characteristics can be obtained by connecting a MOS having the same characteristics as a MOS of the input means to the circuit for generating the divided voltage.

With this voltage generating circuit, a MOS having the same characteristics as the MOS of the comparator circuit is connected to the circuit for generating the divided voltage and the first and second resistors are set to the same resistance value. As a result, the fluctuations due to the process factors are offset and an output signal of the designed-for characteristics can be obtained.

Further, a plurality of divided voltages are generated by a plurality of resistors at the voltage generating circuit and a prescribed divided voltage can be selected by cutting the fuse. As a result, after forming the semiconductor integrated circuit, the divided voltage that minimizes process factor fluctuations can be selected so that an output signal of substantially the designed for characteristics can be obtained.

What is claimed is:

1. A semiconductor integrated circuit, comprising:
   a voltage generating circuit which compares a reference voltage with a voltage applied to a first node, and which generates a control voltage based on a comparison result;
   an amplifier circuit which outputs to an amplified voltage based on the reference voltage at a second node in accordance with the control voltage, the amplifier circuit including a divider circuit which generates a divided voltage to the first node based on a voltage of the second node;
   an input circuit which includes a transistor of a first conductive type having a gate electrode connected to the divider circuit, a first electrode connect to receive a predetermined voltage in accordance with an input voltage, and a second electrode, wherein the input circuit outputs an output signal having an output voltage which is based on the voltage of the second node and the predetermined voltage when the predetermined voltage exceeds a threshold voltage of the transistor; and
   an output circuit which outputs a mode signal having a voltage which is based on the output signal;
   wherein the input circuit further comprises a diode-connected second transistor of a second conductive type connected between a terminal of the input voltage and the first electrode, and a third transistor of the second conductive type connected between the second electrode and a ground voltage supply;

wherein the divider circuit comprises a first resistor element connected to the second node, a second resistor element connected to the first resistor element, and a fourth transistor of the second conductive type having the same characteristics as the second or third transistor connected between the second resistor element and the ground voltage supply.

2. The semiconductor integrated circuit of claim 1, wherein the resistance values of the first resistance element and the second resistance element are equal.

3. A semiconductor integrated circuit, comprising:

a voltage generating circuit which compares a reference voltage with a voltage applied to a first node, and which generates a control voltage based on a comparison result;

an amplifier circuit which outputs to an amplified voltage based on the reference voltage at a second node in accordance with the control voltage, the amplified circuit including a divider circuit which generates a divided voltage to the first node based on a voltage of the second node;

an input circuit which includes a transistor of a first conductive type having a gate electrode connected to the divider circuit, a first electrode connect to receive a predetermined voltage in accordance with an input voltage, and a second electrode, wherein the input circuit outputs an output signal having an output voltage which is based on the voltage of the second node and the predetermined voltage when the predetermined voltage exceeds a threshold voltage of the transistor; and an output circuit which outputs a mode signal having a voltage which is based on the output signal;

wherein the input circuit further comprises a diode-connected second transistor of a second conductive type connected between a terminal of the input voltage and the first electrode, and a third transistor of the second conductive type connected between the second electrode and a ground voltage supply;

wherein the divider circuit comprises a first resistor element connected to the second node, a second resistor element connected to the first resistor element, a fourth transistor of the second conductive type having the same characteristics as the second or third transistor, and a fifth transistor of the first conductive type having the same characteristics as the first transistor connected between the fourth transistor and the ground voltage supply.

4. The semiconductor integrated circuit of claim 3, wherein the resistance values of the first resistance element and the second resistance element are equal.

5. A semiconductor integrated circuit, comprising:

a voltage generating circuit which compares a reference voltage with a voltage applied to a first node, and which generates a control voltage based on a comparison result;

an amplifier circuit which outputs to an amplified voltage based on the reference voltage at a second node in accordance with the control voltage, the amplifier circuit including a divider circuit which generates a divided voltage to the first node based on a voltage of the second node;

an input circuit which outputs an output signal having an output voltage which is based on the voltage of the second node and a predetermined voltage when the predetermined voltage exceeds a threshold voltage; and an output circuit which outputs a mode signal having a voltage which is based on the output signal;

wherein the divider circuit has a plurality of resistor elements connected in series between the second node and a ground voltage supply, and one of a plurality of divided voltages generated by the plurality of resistor elements is selected for transmission to the input circuit.

6. A semiconductor integrated circuit, comprising:

a voltage generating circuit which compares a reference voltage with a voltage applied to a first node, and which generates a control voltage based on a comparison result;

an amplifier circuit which outputs to an amplified voltage based on the reference voltage at a second node in accordance with the control voltage;

an input circuit which includes a transistor of a first conductive type having a gate electrode connected to the second node, a first electrode connect to receive a predetermined voltage in accordance with an input voltage, and a second electrode, wherein the input circuit outputs an output signal having an output voltage which is based on the voltage of the second node and the predetermined voltage when the predetermined voltage exceeds a threshold voltage of the transistor; and an output circuit which outputs a mode signal having a voltage which is based on the output signal;

wherein the input circuit further comprises a diode-connected second transistor of a second conductive type connected between a terminal of the input voltage and the first electrode, and a third transistor of the second conductive type connected between the second electrode and a ground voltage supply.

7. The semiconductor integrated circuit of claim 6, wherein the amplifier circuit includes a divider circuit which generates a divided voltage to the first node based on a voltage of the second node.

8. The semiconductor integrated circuit of claim 7, wherein the divider circuit includes first and second resistor elements connected in series between the second node and a ground voltage supply.

9. A semiconductor integrated circuit, comprising:

a voltage generating circuit which compares a reference voltage with a voltage applied to a first node, and which generates a control voltage based on a comparison result;

an amplifier circuit which outputs to an amplified voltage based on the reference voltage at a second node in accordance with the control voltage, the amplifier circuit including a divider circuit which generates a divided voltage to the first node based on a voltage of the second node;

an input circuit which includes a transistor of a first conductive type having a gate electrode connected to the divider circuit node, a first electrode connect to receive a predetermined voltage in accordance with an input voltage, and a second electrode, wherein the input circuit outputs an output signal having an output voltage which is based on the voltage of the second node and the predetermined voltage when the predetermined voltage exceeds a threshold voltage of the transistor; and an output circuit which outputs a mode signal having a voltage which is based on the output signal.

10. The semiconductor integrated circuit of claim 9, wherein the divider circuit includes first and second resistor elements connected in series between the second node and a ground voltage supply.

* * * * *